United States Patent [19]

Robb

[11] Patent Number: 4,954,988
[45] Date of Patent: Sep. 4, 1990

[54] MEMORY DEVICE WHEREIN A SHADOW REGISTER CORRESPONDS TO EACH MEMORY CELL

[75] Inventor: James R. Robb, Marion, Iowa

[73] Assignee: Rockwell International Corporation, El Segundo, Calif.

[21] Appl. No.: 264,465

[22] Filed: Oct. 28, 1988

[51] Int. Cl.⁵ ............................................. G11C 19/00
[52] U.S. Cl. ................................. 365/189.02; 365/78
[58] Field of Search ....................... 365/73, 75, 77, 78, 365/189.02; 364/964.34

[56] References Cited

FOREIGN PATENT DOCUMENTS 60-7676  1/1985  Japan ............................. 365/189.02

Primary Examiner—Joseph A. Popek
Assistant Examiner—Michael A. Whitfield
Attorney, Agent, or Firm—John C. McFarren; M. Lee Murrah; H. Fredrick Hamann

[57] ABSTRACT

A data storage device includes two registers associated with each cell of the memory. The first register forms a read/write memory register, and the second register forms a write-only shadow register connected to the memory register. During normal operations, each memory register operates as an independent random access memory (RAM) cell and each shadow register operates as an independent write-only RAM cell. When data is written to a shadow register, a flag bit is set. Subsequently, a validity check may be performed to verify the data. If the data does not verify, a clear line may be used to clear the flag bits. If the data verifies, the data in each shadow register with a flag bit set can be loaded into its corresponding memory register in a gang loading operation. If a shadow register flag bit is not set, the data in its corresponding memory register is not changed during gang loading.

15 Claims, 2 Drawing Sheets

MEMORY DEVICE WHEREIN A SHADOW REGISTER CORRESPONDS TO EACH MEMORY CELL

The Government has rights in this invention pursuant to Contract No. F 33615-83C-1036 awarded by the Department of the Air Force.

TECHNICAL FIELD

The present invention relates to random access memories (RAMs) and, in particular, to RAMs in which memory cell includes a read/write memory register connected to a shadow register that functions as an independent write-only memory during normal operations.

BACKGROUND OF THE INVENTION

In certain operations involving data storage and retrieval, the stored data must be updated periodically even though it is being read continually. Such updating operations generally have inefficiencies resulting from delays in loading updated data while waiting for read operations to be completed and delays in subsequent read operations while updated data is being loaded and verified.

One solution to this problem is to employ redundant memories. In a redundant memory system, one memory contains the current data for read operations while the other memory is loaded with updated data as it is received. When the second memory has been loaded and the updated data has been verified, the second memory is switched over as the new current data memory for read operations. This method of alternating redundant memories works well provided each updated memory contains a complete data map. However, this method is not satisfactory for partial loads of updated data.

Therefore, a need has been identified for an improved method and apparatus for updating data in a memory that is being read continually. In such a system it is desirable that delays in loading the updated data, in verifying the updated data, and in reading from the memory while it is being updated be reduced or eliminated.

SUMMARY OF THE INVENTION

The present invention comprises a random access memory (RAM) that has two registers associated with each memory cell. The first register forms a typical read/write memory register. The second register forms a write-only shadow register. A multiplexer connects both a data bus and the shadow register to the read/write memory register.

During normal operations of the memory, each read/write memory register functions as an independent RAM cell and the shadow register functions as an independent write-only RAM cell. Thus, read/write operations involving the memory register and the data bus are not affected by the normal write-only operations of the shadow register. As updated data for the memory comes in, it is written to the shadow registers of the corresponding memory cells. When updated data is written to a shadow register, a data flag is set. Subsequently, a validity check may be performed external to the memory to verify the data that was used to update the shadow registers. If the data does not verify, updated data may be rewritten to the shadow register or a clear line may be used to clear the flags. Once the updated data has been verified, the multiplexer is switched to allow the data in the shadow registers to be loaded into their respective memory registers. The data in each shadow register having a data flag set is loaded into its respective memory register in a single gang loading operation. If a shadow register flag is not set, the data in its corresponding memory register is not changed during gang loading. After the gang loading operation, the multiplexer is switched back to its normal data bus operation mode and the shadow register flags are cleared by means of the clear line.

The present invention of a memory system having shadow register has several operational advantages. First, the writing of updated data into the shadow registers does not affect the operation of the primary read/write memory registers. The shadow registers need to access the memory registers only during the brief time necessary to gang load the updated data into the memory registers. If data validity checks are required, updated data can be loaded into the shadow registers before validity checks are performed. After updated data is written to the shadow registers, the data used for the update may be verified externally without affecting the operation of the main memory registers. If the updated data does not verify, the clear line may be used to clear the data flags so that invalid data is not transferred to the main memory registers. Furthermore, the present invention is highly efficient in that it can be used to update the data only in selected memory registers. When updated data is written into the shadow registers and the flags are set, only the data in those shadow registers having data flags set will be loaded into the main memory registers during gang loading. Gang loading of the memory registers from the shadow registers is very fast and updating is limited to only those memory registers corresponding to shadow registers having data flags set.

BRIEF DESCRIPTION OF THE DRAWINGS

For a more complete understanding of the present invention and for further advantages thereof, reference is made to the following Description of the Preferred Embodiment taken in conjunction with the accompanying Drawings, in which.

DESCRIPTION OF THE PREFERRED EMBODIMENT

Figure 1:
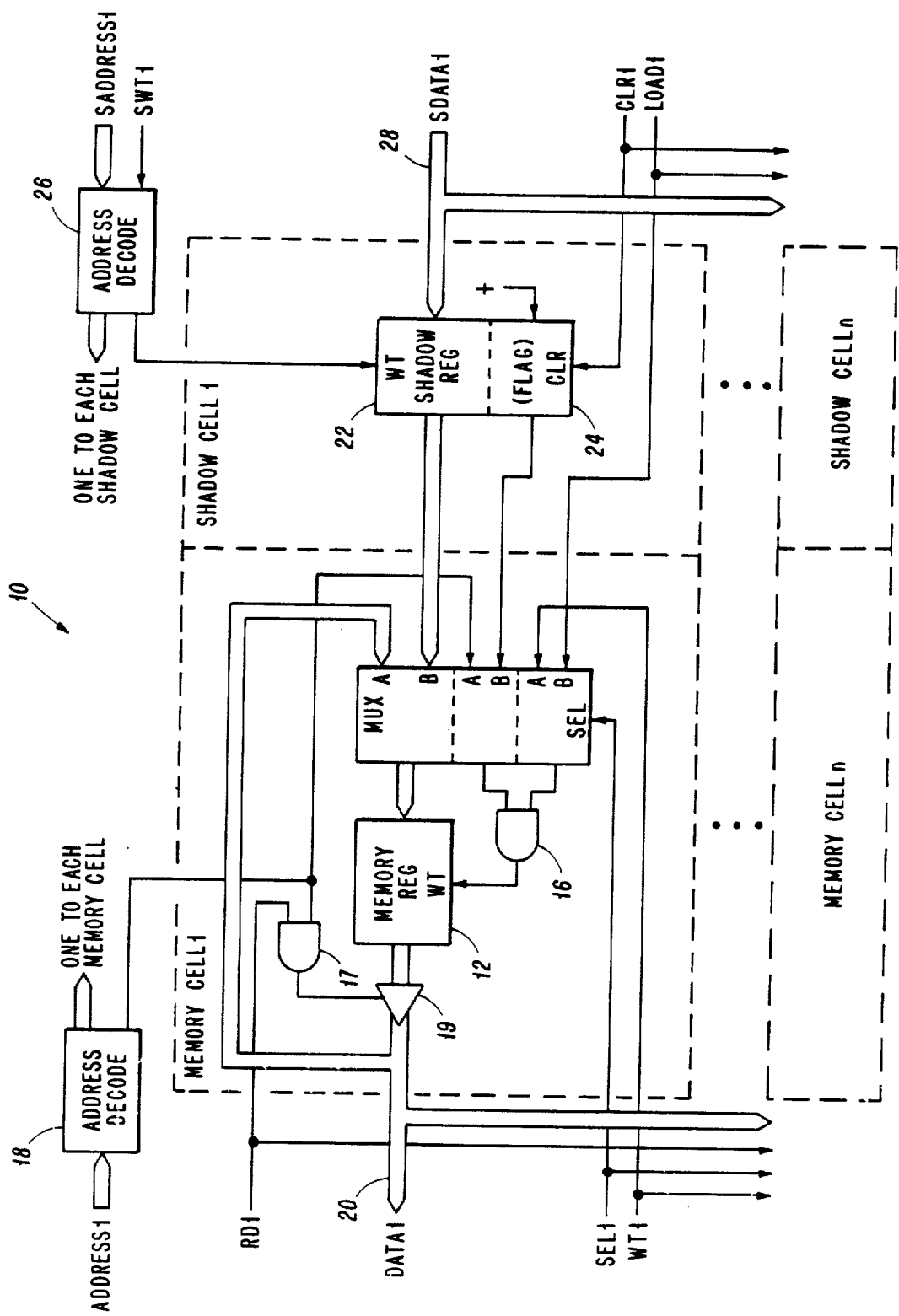
FIG. 1 is a schematic block diagram of a memory cell of the present invention having a shadow register.

One embodiment of the memory device of the present invention is illustrated in schematic block diagram form in FIG. 1. Memory 10 includes a plurality of memory cells such as MEMORY CELL1 that comprises a memory register 12, a multiplexer 14, and logic elements such as AND gates 16 and 17. MEMORY CELL1 has an address decode 18 associated with it for addressing memory register 12. A data bus 20 is connected to memory register 12 for read operations and is connected to multiplexer 14 for write operations. Alternatively, data bus 20 may be connected to memory register 12 only for the purpose of read operations. To read from memory register 12, a signal from address decode 18 is combined with a read signal on line RD1 by AND gate 17, the output of which enables an output buffer 19. To write data to memory register 12 from data bus 20, a signal on select line SEL1 selects channel A of multiplexer 14.

With channel A of multiplexer 14 selected, a signal from address decode 18 and a write signal on line WT1 are combined by AND gate 16, thereby allowing memory register 12 to write from data bus 20.

Memory 10 includes a plurality of cells form MEMORY CELL1 and SHADOW CELL1 through MEMORY CELLn and SHADOW CELLn, respectively. Thus, each memory cell of memory 10 includes a corresponding shadow cell such as SHADOW CELL1 associated with MEMORY CELL1. SHADOW CELL1 includes a shadow register 22 and a flag bit 24. In addition, SHADOW CELL1 is addressable by means of address decode 26. Data may be written to shadow register 22 from shadow register data bus 28. Shadow register 22 is a write-only memory with respect to shadow data bus 28. When data is written to shadow register 22, flag bit 24 is set. A clear line CLR1 is used to clear the flag bit 24.

During normal operation of memory 10, channel A of multiplexer 14 is selected by means of select line SEL1 so that memory register 12 functions as an independent random access memory (RAM) cell and shadow register 22 functions as an independent write-only RAM cell isolated from memory register 12. When the data in memory register 12 is to be updated by entry of the data stored in shadow register 22, a signal on select line SEL1 switches multiplexer 14 to channel B. In channel B, a load signal on line LOAD1 is combined with flag bit 24 by AND gate 16 to form a write storbe WT to memory register 12, thereby causing the data in shadow register 22 to be loaded into memory register 12 through multiplexer channel B. AND gate 16 ensures that the contents of memory register 12 are not changed if flag bit 24 is not set. The plurality of memory registers of memory 10 are updated simultaneously with the contents of their corresponding shadow registers in a gang loading operation. However, only those memory registers whose corresponding shadow register flag bits have been set will be loaded with updated data during the gang loading operation.

A memory with shadow registers has several advantages. During normal operations, the loading of data into shadow register 22 does not affect the operation of memory register 12. Thus, data destined for updating of memory register 12 may be written into shadow register 22 without delay as it arrives. If a validity check is required for the new data before it is loaded into memory register 12, the validity check can be completed externally without affecting the operation of memory register 12. Furthermore, if the new data used to update shadow register 22 does not verify, flag bit 24 may be cleared by means of clear line CLR1. This prevents any invalid data from being transferred from shadow register 22 to memory register 12. In addition, only selected memory registers of memory 10, rather than all of the memory registers, may be updated at a given time. Only those memory registers whose shadow registers contain updated data as indicated by the flag bits will be loaded during the gang loading operation.

Figure 2:
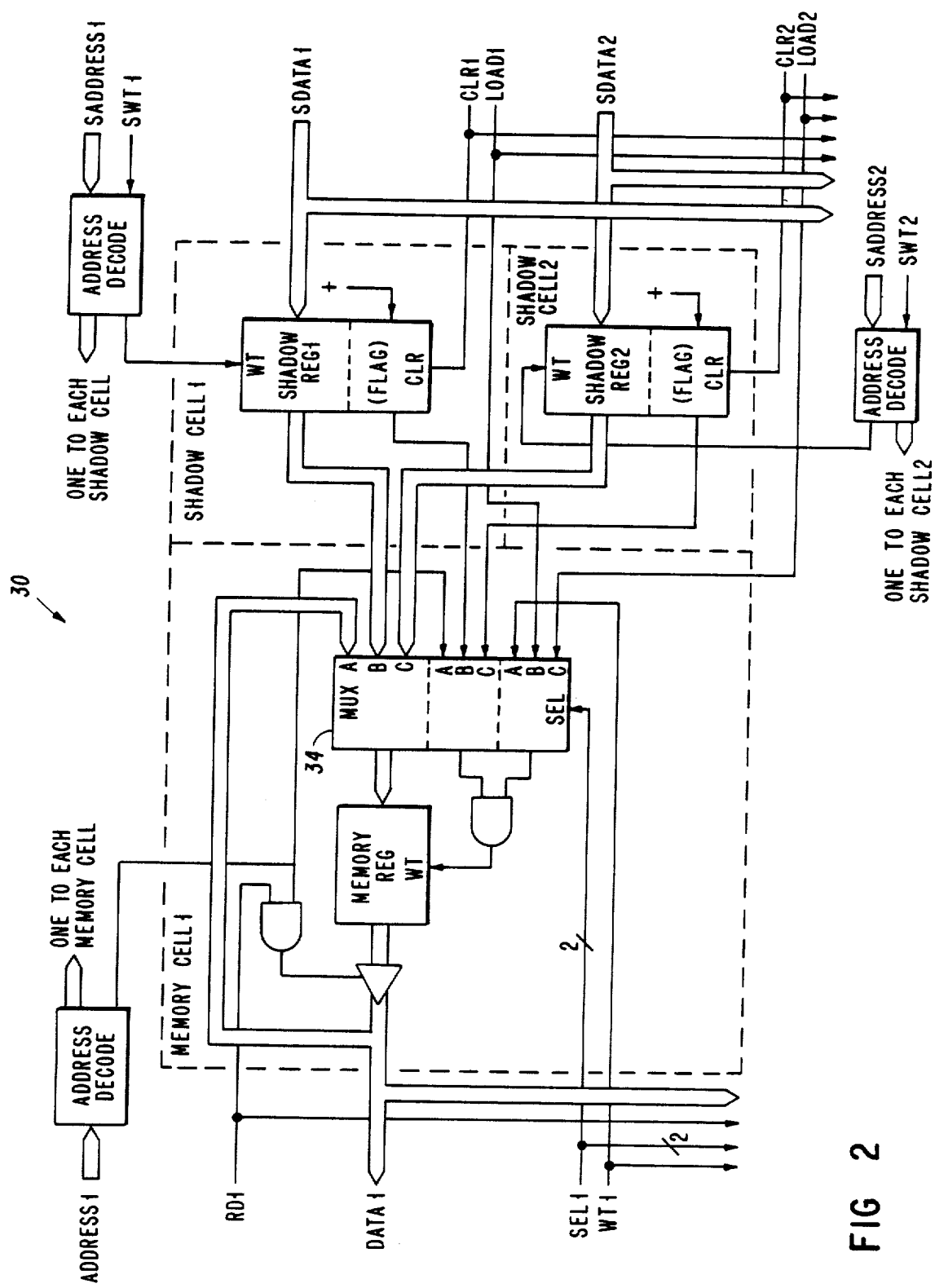
FIG. 2 is a schematic block diagram of a memory cell of the present invention having dual shadow registers.

Another embodiment of the present invention is illustrated in FIG. 2. Memory 30, like memory 10, comprises a plurality of identical memory cells, of which MEMORY CELL1 is representative. Memory 30 is similar to memory 10 except that it comprises dual shadow registers for each memory cell. As illustrated in FIG. 2, SHADOW CELL1 and SHADOW CELL2 are associated with MEMORY CELL1. In memory 30, multiplexer 34 includes a third channel C to accomodate the extra shadow register. Otherwise, the structure and operation of memory 30 is analogous to that described above in conjunction with memory 10.

Memory 10 with a single shadow register might be used, for example, in updating a table of variables. Updated variables could be loaded into the shadow registers and periodically transferred into the memory registers. The present invention allows new data to be written into the shadow registers while the data bus is accessing current stable data in the memory registers. Only when the central processor is ready for an update of the table of variables would the new data be transferred from the shadow registers into the memory registers in a gang loading operation. In addition, individual memory registers would be changed only if updated data is stored in their corresponding shadow registers, as indicated by the flag bits.

Memory 30 with dual shadow registers might be used, for example, in a dual redundant serial communications network. Each channel of an incoming message could be loaded into a corresponding shadow memory as the message is received. At the end of the message string, a validity check could be performed on the new data used to load the dual shadow registers. If the validity check showed that a valid message had been received, then the shadow registers (if any) containing valid data would be selected for gang loading into the corresponding memory registers. Because the data may be written into the shadow registers as the message is being received, and because the memory registers are gang loaded as soon as the validity check is complete, there is very little delay between the reception of the message and the loading of the memory registers.

Although the present invention has been described with respect to specific embodiments thereof, various changes and modifications may be suggested to one skilled in the art, and it is intended that the present invention encompass such changes and modifications as fall within the scope of the appended claims.

I claim:

1. A data storage device for use with a data bus, comprising:
    a plurality of memory cells;
    a plurality of shadow registers, each of said shadow registers connected to a corresponding one of said memory cells; and
    a plurality of multiplexers connected between corresponding ones of said memory cells and shadow registers for gang loading data from said shadow registers into said corresponding memory cells, each of said multiplexers having a first channel connected to the data bus and a second channel connected to said corresponding shadow register, said second channel for loading data from said shadow register into said memory cell.

2. The data storage device of claim 1, further comprising a second plurality of shadow registers, said second shadow registers connected, respectively, to said corresponding multiplexer.

3. The data storage device of claim 2, wherein each of said multiplexers has a third channel connected to said corresponding second shadow register for loading data from said second shadow register into said corresponding memory cell.

4. The data storage device of claim 1, wherein each of said shadow registers includes a flag bit settable when data is entered into said shadow register.

5. The data storage device of claim 4, further comprising means for clearing said flag bit in said shadow register.

6. A random access memory (RAM), comprising:
a plurality of read/write memory cells;
a plurality of write-only shadow registers;
a plurality of multiplexers, each of said multiplexers connected between a corresponding one of said memory cells and a corresponding one of said shadow registers;
a flag bit in each of said shadow registers settable when data is entered into said shadow register; and
means for gang loading data from each of said shadow registers having a flag bit set into said corresponding memory cells.

7. The RAM of claim 6, further comprising means for clearing said flag bit in each of said shadow registers.

8. The RAM of claim 6, wherein each of said multiplexers comprises a first channel connected to a data bus and a second channel connected to said corresponding shadow register, said second channel for loading data from said shadow register into said corresponding memory cell.

9. The RAM of claim 8, further comprising a second plurality of shadow registers, each of said second shadow registers connected to said corresponding multiplexers.

10. The RAM of claim 9, wherein each of said multiplexers further comprises a third channel connected to said corresponding second shadow register for loading data from said second shadow register into said corresponding memory cell.

11. The RAM of claim 10, further comprising means for individually addressing each of said memory cells and said first and second shadow registers.

12. A method of updating data in a data storage device having a plurality of memory cells, comprising the steps of:
connecting each of the plurality of shadow registers to a corresponding one of the plurality of memory cells;
entering data into selected ones of said shadow registers;
setting a flag bit in each shadow register having entered data; and
gang loading the data in each of said shadow registers having a flag bit set into the corresponding memory cells.

13. The method of claim 12, further comprising the step of verifying the data entered into said shadow registers before gand loading the data into the memory cells.

14. The method claim 13, further comprising the step of clearing said flag bits before gang loading if the data does not verify.

15. The method of claim 12, further comprising the step of clearing said flag bits after gang loading of the data into the memory cells.

* * * * *